(12) United States Patent
Robinson et al.

(10) Patent No.: US 11,551,929 B2
(45) Date of Patent: Jan. 10, 2023

(54) METHOD OF GROWING CRYSTALLINE LAYERS ON AMORPHOUS SUBSTRATES USING TWO-DIMENSIONAL AND ATOMIC LAYER SEEDS

(71) Applicant: THE PENN STATE RESEARCH FOUNDATION, University Park, PA (US)

(72) Inventors: Joshua A. Robinson, Spring Mills, PA (US); Natalie Briggs, Benton City, WA (US)

(73) Assignee: THE PENN STATE RESEARCH FOUNDATION, University Park (PA)

( * ) Notice: Subject to any disclaimer, the term of this patent is extended or adjusted under 35 U.S.C. 154(b) by 0 days.

(21) Appl. No.: 17/301,117

(22) Filed: Mar. 25, 2021

(65) Prior Publication Data

US 2021/0217617 A1 Jul. 15, 2021

Related U.S. Application Data

(63) Continuation of application No. PCT/US2019/053450, filed on Sep. 27, 2019.

(60) Provisional application No. 62/738,846, filed on Sep. 28, 2018.

(51) Int. Cl.
  *C30B 1/02* (2006.01)
  *H01L 21/02* (2006.01)

(52) U.S. Cl.
  CPC ......... *H01L 21/02568* (2013.01); *C30B 1/02* (2013.01); *C30B 1/023* (2013.01); *H01L 21/02631* (2013.01)

(58) Field of Classification Search
  CPC ......... H01L 21/02568; H01L 21/02631; C30B 1/02; C30B 1/023; C30B 29/06
  See application file for complete search history.

(56) References Cited

U.S. PATENT DOCUMENTS

| | | | |
|---|---|---|---|
| 6,204,518 B1 | 3/2001 | Adan et al. | |
| 6,534,380 B1 | 3/2003 | Yamauchi et al. | |
| 6,916,717 B2 | 7/2005 | Li et al. | |
| 8,846,505 B2 | 9/2014 | Einav | |
| 9,650,723 B1* | 5/2017 | D'Evelyn | ................ C30B 9/00 |
| 2004/0086802 A1 | 5/2004 | Gibson | |

(Continued)

FOREIGN PATENT DOCUMENTS

| | | |
|---|---|---|
| CN | 107994099 B | 8/2019 |
| EP | 3217423 A1 | 9/2017 |

(Continued)

OTHER PUBLICATIONS

Al Balushi et al., "Two-dimensional gallium nitride realized via graphene encapsulation", Nature Materials, vol. 15, pp. 1166-1173, Nov. 2016.

(Continued)

*Primary Examiner* — Robert M Kunemund
(74) *Attorney, Agent, or Firm* — McKee, Voorhees & Sease, PLC

(57) ABSTRACT

This disclosure relates to methods of growing crystalline layers on amorphous substrates by way of an ultra-thin seed layer, methods for preparing the seed layer, and compositions comprising both. In an aspect of the invention, the crystalline layers can be thin films. In a preferred embodiment, these thin films can be free-standing.

15 Claims, 6 Drawing Sheets

(56) References Cited

U.S. PATENT DOCUMENTS

| | | | |
|---|---|---|---|
| 2012/0204957 A1* | 8/2012 | Nicholls | H01L 33/0075 257/E31.022 |
| 2017/0170260 A1* | 6/2017 | Dresselhaus | H01L 29/068 |
| 2017/0175258 A1 | 6/2017 | Robinson et al. | |

FOREIGN PATENT DOCUMENTS

| | | |
|---|---|---|
| TW | I451474 B | 9/2014 |
| WO | 2008048303 A2 | 4/2008 |
| WO | 2015020610 A1 | 2/2015 |
| WO | 2017153909 A1 | 9/2017 |

OTHER PUBLICATIONS

Ambacher, O., "Growth and applications of Group III-nitrides", J. Phys. D: Appl. Phys., vol. 31, pp. 2653-2710, 1998.

Bandurin et al., "High electron mobility, quantum Hall effect and anomalous optical response in atomically thin InSe", Nature Nanotechnology, 6 pages, Nov. 21, 2016.

Blöchl, P.E., "Projector augmented-wave method", Physical Review B, vol. 50, No. 24, 27 pages, Dec. 15, 1994.

Briggs et al., "Transformation of 2D group-III selenides to ultra-thin nitrides: enabling epitaxy on amorphous substrates", Nanotechnology, vol. 29, 6 pages, 2018.

Carin et al., "An XPS Study of GaN Thin Films on GaAs", Surface and Interface Analysis, vol. 16, pp. 65-69, 1990.

Gautam et al., "GaS and GaSe nanowalls and their transformation to Ga2O3 and Gan nanowalls", Chem. Commun., pp. 3995-3997, Jun. 9, 2005.

Hedman et al., "Gallium Nitride studied by Electron Spectroscopy", Physica Scripta., vol. 22, pp. 176-178, 1980.

Honda et al., "Uniform growth of GaN on AlN templated (111)Si substrate by HVPE", Phys. Stat. Sol., vol. (c)2, No. 7, pp. 2125-2128, Apr. 1, 2005.

Hu et al., "Synthesis of Few-Layer GaSe Nanosheets for High Performance Photodetectors", ACS Nano, vol. 6, No. 7, pp. 5988-5994, Jun. 4, 2012.

The Penn State Research Foundation in connection with PCT/US19/53450 filed Sep. 27, 2019, "International Search Report and the Written Opinion of the International Searching Authority, or the Declaration", 10 pages, dated Dec. 17, 2019.

Jung et al., "Red-to-Ultraviolet Emission Tuning of Two-Dimensional Gallium Sulfide/Selenide", ACS Nano, vol. 9, No. 10, pp. 9585-9593, Sep. 5, 2015.

Khan et al., "III-Nitride UV Devices", Japanese Journal of Applied Physics, vol. 44, No. 10, pp. 7191-7206, Oct. 11, 2005.

Kim et al., "Remote epitaxy through graphene enables two-dimensional material-based layer transfer", Nature, vol. 544, 13 pages, Apr. 20, 2017.

Kim et al., "Wafer-scale production of highly uniform two-dimensional MoS2 by metal-organic chemical vapor deposition", Nanotechnology, vol. 28, 8 pages, Apr. 7, 2017.

Kresse et al., "Efficient iterative schemes for ab initio total-energy calculations using a plane-wave basis set", Physical Review B, Vo. 54, No. 16, 18 pages, Oct. 15, 1996.

Kuhn et al., "Crystal Structure and Interatomic Distances in GaSe", Phys. Stat. Sol., vol. 31, pp. 469-475, 1975.

Lei et al., "Synthesis and Photoresponse of Large GaSe Atomic Layers", Nano Letters, vol. 13, pp. 2777-2781, Jun. 3, 2013.

Leszczynski et al., "Lattice parameters of gallium nitride", Appl. Phys. Lett., vol. 69(1), pp. 73-75, Jul. 1, 1996.

Li et al., "Controlled Vapor Phase Growth of Single Crystalline, Two-Dimensional GaSe Crystals with High Photoresponse", Scientific Reports, vol. 4:5497, 9 pages, Jun. 30, 2014.

Liu et al., "Template Approach to Crystalline GaN Nanosheets", Nano Letters, vol. 17, pp. 3195-3201, Apr. 17, 2017.

Mudd et al., "High Broad-Band Photoresponsivity of Mechanically Formed InSe-Graphene van der Waals Heterostructures", Advanced Materials, vol. 27, pp. 3760-3766, 2015.

Paskova et al., "GaN Substrates for III-Nitride Devices", Proceedings of the IEEE, vol. 98, No. 7, pp. 1324-1338, Jul. 2010.

Pearson et al., "Kinetics of the Thermal Decomposition of H2Se", Int. J. Hydrogen Energy, vol. 6, No. 5, pp. 509-519, 1981.

Perdew et al., "Generalized Gradient Approximation Made Simple", Physical Review Letters, vol. 77, No. 18, pp. 3865-3868, Oct. 28, 1996.

International Searching Authority in connection with PCT/US19/53450 filed Sep. 27, 2019, "PCT Recordation of Search History", 8 pages, completed Nov. 14, 2019.

Riedl et al., "Structural and electronic properties of epitaxial graphene on SiC(0 0 0 1): a review of growth, characterization, transfer doping and hydrogen intercalation", J. Phys. D: Appl. Phys., vol. 43, 17 pages, Sep. 2, 2010.

Ross et al., "Electrically tunable excitonic light-emitting diodes based on monolayer WSe2 p-n junctions", Nature Nanotechnology, vol. 9, pp. 268-272, Apr. 2014.

Ruzmetov et al., "Vertical 2D/3D Semiconductor Heterostructures Based on Epitaxial Molybdenum Disulfide and Gallium Nitride", ACS Nano, vol. 10, pp. 3580-3588, Feb. 11, 2016.

Samarth, Nitin, "Quantum materials discovery from a synthesis perspective", Nature Materials, vol. 16, pp. 1068-1076, Nov. 2017.

Sreedhara et al., "Synthesis and Characterization of Few-layer Nanosheets of GaN and Other Metal Nitrides", Z. Anorg. Allg. Chem., vol. 640(14), pp. 2737-2741, 2014.

Usui et al., "Thick GaN Epitaxial Growth with Low Dislocation Density by Hydride Vapor Phase Epitaxy", Jpn. J. Appl. Phys., vol. 36, Part 2, No. 7B, pp. 899-902, Jul. 15, 1997.

Zubair et al., "Hot Electron Transistor with van der Waals Base-Collector Heterojunction and High-Performance GaN Emitter", Nano Letters, vol. 17, pp. 3089-3096, Apr. 17, 2017.

* cited by examiner

METHOD OF GROWING CRYSTALLINE LAYERS ON AMORPHOUS SUBSTRATES USING TWO-DIMENSIONAL AND ATOMIC LAYER SEEDS

CROSS-REFERENCE TO RELATED APPLICATION

This application is a Continuation of PCT/US19/53450 filed on Sep. 27, 2019, which claims priority under 35 U.S.C. § 119 to U.S. Provisional Application Ser. No. 62/738,846 filed on Sep. 28, 2019, each of which is hereby expressly incorporated by reference in its entirety, including, without limitation, the specification, claims, and abstract, as well as any figures, tables, or drawings thereof.

GRANT REFERENCE

This invention was made with government support under Grant No. DMR1539916 awarded by the National Science Foundation and under Grant No. W911NF-15-1-0488 awarded by the U.S. Army/ARO. The Government has certain rights in the invention.

FIELD OF THE INVENTION

The invention relates to a method of growing crystalline layers on amorphous substrates by way of an ultra-thin seed layer, methods for preparing the seed layer, and compositions of both.

BACKGROUND OF THE INVENTION

It has been well recognized that there are many benefits of producing nitride layers, such as AlGaN or GaN structures, on silicon substrates instead of substrates such as sapphire, as silicon is inexpensive, has a relatively high thermal conductivity, and is electrically conductive. In particular, Group III-V materials exhibit desirable optical and electronic properties and thus are especially suitable for semiconductor and related applications. GaN specifically exhibits a wider band gap, higher breakdown field, and higher electron mobility over traditional Si and can be used for high voltage, high power devices. When in its two-dimensional (2D) form, GaN has an ultra-wide band gap and can operate in the entire ultra-violate, visible, and infrared spectrum, apt for electro-optic devices. However, there are significant limitations on the synthesis of high-quality single-crystalline Group III-V films.

First, there are significant limitations in nitride material synthesis. A lack of native substrates and difficulty in further growing nitrides on native substrates stems largely from difficulties inherent to nitride synthesis—primarily the high nitrogen overpressure required to avoid film decomposition and to produce high-quality material as well as the low solubility of nitrogen in the respective metal. Relatedly, there remains difficulty in growing the films on native substrates due to lattice mismatch.

Additionally, there is a significant problem stemming from the uncontrolled formation of amorphous $SiN_x$, on the silicon surface due to lattice mismatch. This occurs, for example, when a gaseous nitrogen source is used during molecular beam epitaxial growth on a silicon substrate, for once the epitaxial chamber is exposed to nitrogen, or nitrogen containing gases or compounds, a nitrogen background is then present in the growth apparatus in subsequent growth experiments. In the case of a silicon substrate, such a nitrogen background results in the formation of a thin amorphous layer of $SiN_x$ at the surface of the silicon, once the wafer is heated to the growth temperature. The layer of $SiN_x$, which is at most a few monolayers thick, forms spontaneously and is therefore difficult to control. This layer typically is not uniform, and the surface coverage it provides is typically in the form of islands. The average thickness of this layer depends on the background pressure of nitrogen, the temperature of the substrate, the exposure time, and details of the silicon surface structure. Even in a very clean system, i.e. with a low nitrogen background, formation of the Si—N bonds cannot be prevented.

There have been attempts to solve this problem, but none have been satisfactory. For example the use of low temperature nucleation has been utilized; however, this method tends to result in uncontrolled domain structure and poor layer quality. Alternatively, others have attempted the formation of a stable Al—Si phase (i.e. the γ-phase), but this method tends to result in an AlN with at least two types of domains. Thus, closely lattice-matched epitaxial substrates are traditionally needed for the growth of high-quality single-crystal films.

Furthermore, in recent years the exponential growth of research on 2D materials (such as graphene, $MoS_2$, h-BN, GaN, etc.) has enabled the exploration of 2D materials and devices dramatically. Much of the focus has been on 2D transition metal dichalcogenides (TMDs) such as $MoS_2$ and $WSe_2$ as candidates for electronics. There is some exploration of 2D Group-III chalcogenide (GIIIC) materials as these materials have many desirable properties, such as high electron mobility (e.g. InSe), high photoresponsivity, and large band gaps (e.g. GaSe, GaS). However, reliable and cost-effective methods have not yet been developed to utilize GIIIC materials in forming ultra-thin GaN layers.

As a result, there is a need to develop improved methods of nitride material synthesis.

There is also a need to develop reliable and cost-effective methods of forming ultra-thin Group III-V layers on amorphous silicon substrate.

Further, there is a need to develop reliable and cost-effective methods have not yet been developed to utilize GIIIC materials in forming ultra-thin GaN layers.

BRIEF SUMMARY OF PREFERRED EMBODIMENTS

This invention describes the growth of single-crystal Group III-V material through use of an ultra-thin seed layer. The seed layer comprises a Group III chalcogenide that is, in one embodiment, annealed in $NH_3$ leading to the formation of nanocrystalline, ultra-thin Group III nitride layer. This seed layer allows for growth of crystalline layer, even on amorphous substrates, such as $SiO_2$.

A preferred embodiment is a method of using seed layers to grow a thin film, comprising growing a two-dimensional (2D) layer on a substrate; treating the two-dimensional (2D) layer to form one or more seed layers; wherein the one or more seed layers are formed by a chemical conversion; and transforming the one or more seed layers into a thin film. In a preferred embodiment, the treating step can comprise exfoliation. In a preferred embodiment, the chemical conversion can comprise annealing. In a preferred embodiment, the transforming step can comprise conducting epitaxial growth, wherein the epitaxial growth comprises hydride vapor phase epitaxy (HVPE), chemical vapor deposition (MOCVD), plasma enhanced chemical vapor deposition (PECVD), molecular beam epitaxy (MBE), liquid phase exfoliation, and/or remote epitaxy.

A preferred embodiment is a thin film prepared by a process of using seed layers. Preferably the thin film is prepared by growing a two-dimensional (2D) layer comprising GaSe on an amorphous substrate comprising silicon dioxide and/or silicon; annealing the two-dimensional (2D) layer with ammonia to form one or more seed layers comprising GaN; and transforming the one or more seed layers into a crystalline thin film; wherein the crystalline thin film is a single-crystal or polycrystalline film.

BRIEF DESCRIPTION OF THE FIGURES

The following figures form part of the specification and are included to further demonstrate certain embodiments or various aspects of the invention. In some instances, embodiments of the invention can be best understood by referring to the accompanying figures in combination with the detailed description presented herein. The description and accompanying figures may highlight a certain specific example, or a certain aspect of the invention. However, one skilled in the art will understand that portions of the example or aspect may be used in combination with other examples or aspects of the invention.

DETAILED DESCRIPTION OF THE INVENTION

Figure 1A:
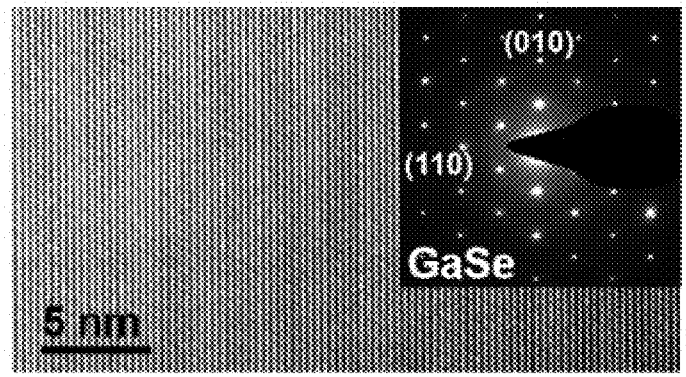
FIG. 1A shows a high resolution TEM image of a GaSe layer before nitridation. The inset shows the corresponding SAED pattern confirming GaSe.

The present invention relates to the method of realization of Group III-V layer on amorphous substrates. In particular, by use of a Group III chalcogenide ultra-thin seed layer.

Definitions

So that the present invention may be more readily understood, certain terms are first defined. Unless defined otherwise, all technical and scientific terms used herein have the same meaning as commonly understood by one of ordinary skill in the art to which embodiments of the invention pertain. Many methods and materials similar, modified, or equivalent to those described herein can be used in the practice of the embodiments of the present invention without undue experimentation, the preferred materials and methods are described herein. In describing and claiming the embodiments of the present invention, the following terminology will be used in accordance with the definitions set out below.

It is to be understood that all terminology used herein is for the purpose of describing particular embodiments only, and is not intended to be limiting in any manner or scope. For example, as used in this specification and the appended claims, the singular forms "a," "an" and "the" can include plural referents unless the content clearly indicates otherwise. Further, all units, prefixes, and symbols may be denoted in its SI accepted form.

Numeric ranges recited within the specification are inclusive of the numbers defining the range and include each integer within the defined range. Throughout this disclosure, various aspects of this invention are presented in a range format. It should be understood that the description in range format is merely for convenience and brevity and should not be construed as an inflexible limitation on the scope of the invention. Accordingly, the description of a range should be considered to have specifically disclosed all the possible sub-ranges, fractions, and individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 3, 4, 5, and 6, and decimals and fractions, for example, 1.2, 3.8, 1'₂, and 4% This applies regardless of the breadth of the range.

The term "about," as used herein, refers to variation in the numerical quantity that can occur, for example, through typical measuring techniques and equipment, with respect to any quantifiable variable, including, but not limited to, mass, volume, time, distance, wave length, frequency, voltage, current, and electromagnetic field. Further, given solid and liquid handling procedures used in the real world, there is certain inadvertent error and variation that is likely through differences in the manufacture, source, or purity of the ingredients used to make the compositions or carry out the methods and the like. The term "about" also encompasses amounts that differ due to different equilibrium conditions for a composition resulting from a particular initial mixture. The term "about" also encompasses these variations. Whether or not modified by the term "about," the claims include equivalents to the quantities.

The term "functionalized," as used herein, refers to a molecule having a certain functional group.

As used herein the term "polymer" refers to a molecular complex comprised of a more than ten monomeric units and generally includes, but is not limited to, homopolymers, copolymers, such as for example, block, graft, random and alternating copolymers, terpolymers, and higher "x"mers, further including their analogs, derivatives, combinations, and blends thereof. Furthermore, unless otherwise specifically limited, the term "polymer" shall include all possible isomeric configurations of the molecule, including, but are not limited to isotactic, syndiotactic and random symmetries, and combinations thereof. Furthermore, unless otherwise specifically limited, the term "polymer" shall include all possible geometrical configurations of the molecule.

"Cross-linking," as used herein, refers to the attachment of two or more polymer chains by bridges of an element, a molecular group, or a compound. In general, crosslinking of the compounds of the invention takes place upon heating. As cross-linking density is increased, the properties of a material can be changed from thermoplastic to thermosetting.

The term "amine" (or "amino") as used herein refers to —$R^{32}NR^{33}R^{34}$ groups. $R^{32}$ is absent, a substituted or unsubstituted alkylene, cycloalkylene, alkenylene, alkynylene, arylene, aralkylene, heterocyclylalkylene, or heterocyclylene group as defined herein. $R^{33}$ and $R^{34}$ are independently hydrogen, or a substituted or unsubstituted alkyl, cycloalkyl, alkenyl, alkynyl, aryl, aralkyl, heterocyclylalkyl, or heterocyclyl group as defined herein. The term "amine" as used herein also refers to an independent compound. When an amine is a compound, it can be represented by a formula of $R^{32'}NR^{33'}R^{34'}$ groups, wherein $R^{32'}$ $R^{33'}$, and $R^{34}$ are independently hydrogen, or a substituted or unsubstituted alkyl, cycloalkyl, alkenyl, alkynyl, aryl, aralkyl, heterocyclylalkyl, or heterocyclyl group as defined herein.

The term "amide," or "amido," as used herein, refers to an acyl group having the general formula —C(O)N(R)(R), —N(H)C(O)(R), or —N(R)C(O)(R), where each instance of R is, hydrogen, hydroxy, thio, amino, aliphatic, carbocyclic, heteroaliphatic, alkyl, alkenyl, alkynyl, aryl, alkyloxy, alkylthioxy, alkylamino, dialkylamino, arylamino, diarylamino, aryl, heteroaryl, or heterocycyl.

The term "imide," or "imido," as used herein, refers to a group having the general formula —C(=NR)R, —OC(=NH)R, —OC(=NR)R, —C(=NH)R, —N(H)C(=NH)R, —N(H)C(=NR)R, —N(R)C(=NH)R, or —N(R)C(=NR)R, where each instance of R is, independently, aliphatic, heteroaliphatic, aryl, heteroaryl or heterocyclyl.

As used herein, the term "imine" refers to an organic compound that includes at least one carbon-nitrogen double bond, according to the general formula —R—N=R—, or more particularly —C=NH or —C=NR where R is an alkyl or other group.

The term "azide" as used herein refers to a compound containing the azido group —$N_3$ or the anion $N_3$—. A common azide is sodium azide, $NaN_3$.

The term "nitrate" as used herein refers to a salt or ester of nitric acid generally containing the anion $NO_3$— or the group —$NO_3$.

The term "nitrite" as used herein refers to a salt or ester of nitrous acid, generally containing the anion $NO_2$— or the group —$NO_2$.

The term "nitrile" as used herein is represented by the formula —CN and refers to an organic compound containing a cyanide group bound to an alkyl group.

The term "cyanate" refers to isocyanate materials and isothiocyanate materials that are unblocked and capable of forming a covalent bond with a reactive group such as a thiol, hydroxyl, or amine function group.

References to elements herein are intended to encompass any or all of their oxidative states and isotopes. For example discussion of aluminum can include $Al^I$, $Al^{II}$, or $Al^{III}$ and references to boron include any of its isotopes, i.e., $^6B$, $^7B$, $^9B$, $^{10}B$, $^{11}B$, $^{12}B$, $^{13}B$, $^{14}B$, $^{15}B$, $^{16}B$, $^{17}B$, $^{18}B$, and $^{19}B$.

As used herein, the term "Group III" means and includes the elements B, Al, Ga, In, Tl. This group is also known as International Union of Pure and Applied Chemistry (IUPAC) Group 13, or, more generally, the Boron group.

As used herein, the term "Group V" means and includes the elements N, P, As, Sb, and Bi. This group of elements is also known as IUPAC Group 15, or, more generally, the Nitrogen group.

As used herein, the term "chalcogen" means and includes the elements O, S, Se, Te and Po. This group of elements is also known as IUPAC Group 16, or the Oxygen group.

As used herein, the term "Group III chalcogenide" means and includes any chemical compound consisting of at least one chalcogen element and at least one Group III element.

As used herein, the term "Group III-V" means and includes any chemical compound with at least one Group III element and at least one Group V element.

The term "thin film" refers to a layer of material(s) with a minimal thickness, typically ranging from fractions of a nanometer to several micrometers. Thin layers may be deposited using a wide variety of methods, typically either chemical or physical. Generally chemical deposition is a process by which a substrate is fully submerged in a chemical fluid and then the material is deposited on the surface in a conformal pattern. Chemical deposition often occurs by, for example, plating, chemical solution deposition (CSD), and/or chemical vapor deposition (CVD), including epitaxial growth. Alternatively, physical deposition methods generally rely on mechanical or thermodynamic methods to produce thin films. Physical deposition may occur by, for example, thermal evaporation, sputtering, cathodic arc deposition (Arc-PVD), and/or pulsed laser deposition.

The terms "two-dimensional" and "2D" refer to single crystal materials whose properties may arise not only from their composition but also their sheet-like structures. Relatedly, 2D layer growth refers to thin film growth perpetuated by the formation of one or more 2D sheets layered on top of each other, i.e. layer by layer. This method of growth is sometimes referred to as Franck-van der Merwe growth. On some occasions, 2D layer growth will occur until a critical thickness after which the growth also starts to proceed in a 3D island fashion. This method of growth is referred to as Stanski-Krastanow growth. Suitable 2D materials according to the present application may include, without limitation, graphene, $MoS_2$, h-BN, GaN, and/or GIIIC materials. 2D materials may be used for any suitable type of epitaxial growth, including remote epitaxy.

The terms "three dimensional" and "3D" refer to crystal materials extending in three dimensions, along an x, y, and z axis, such as length, width, and height. Relatedly, 3D layer growth refers to thin film growth perpetuated by the formation of one or more three dimensional islands. This method of growth is referred to as Volmer-Weber growth. 3D materials may be used for any suitable type of epitaxial growth.

As used herein, the terms "epitaxy," "epitaxial growth," and "epitaxial film growth" refer to the growth of a layer which continues the crystal structure of a substrate. The material grown may be the same as the substrate (i.e. homoepitaxy) or a different material (i.e. heteroepitaxy).

Overall, epitaxial growth is a highly controllable method for assembling dissimilar materials into artificial structures with a high level of precision. In particular, homoepitaxial growth by CVD is key in silicon integrated circuit technology because it enables the growth of a lightly doped semiconductor on top of a heavily doped semiconductor.

As used herein, the term "epitaxial temperature" refers to the temperature necessary for epitaxial growth in a particular system, and under particular specific deposition conditions. It will be understood that the given system and deposition conditions will vary based on the specific materials used.

As used herein, the term "amorphous" means that the atoms in a particular material, e.g. film, are randomly packed with no specific order. An amorphous film may be compared with a (poly)crystalline film, which has a long-range order, i.e. its atoms are arranged in a highly ordered fashion forming a lattice.

Nitride Semiconductors

Nitride semiconductors have been researched extensively for over fifty years, owing to their remarkable optical and electronic properties. In particular, nitride thin films, which generally have a thickness of between fractions of a nanometer to several micrometers, may be used in semiconductor applications. As a result of continued research and development, nitride materials (gallium nitride and its alloys in particular) have seen commercial application in technologies such as light emitting diodes and high-power devices. Most of the III-V nitride devices are grown on foreign substrates such as sapphire ($Al_2O_3$) and silicon carbide (SiC) because of the lack of available low-cost, high-quality, large-area native substrates such as GaN substrates. For example, blue LEDs are mostly grown on insulating sapphire substrates or conductive silicon carbide substrates using a metal-organic chemical vapor deposition (MOCVD) process. Sapphire belongs to the trigonal symmetry group, while SiC belongs to the hexagonal symmetry group. GaN films and InGaN films have been heteroepitaxially grown on the c-plane sapphire surface for LED devices. Due to lattice mismatch, the GaN films grown on both sapphire and SiC substrates typically have high crystal defects with a dislocation density of $10^9$ to $10^{10}$ $cm^{-3}$. Despite the high defect density of the LEDs grown on these substrates, commercial LEDs have long lifetimes suitable for some applications. However, significant limitations in nitride material synthesis remain. A lack of native substrates and difficulty in further growing nitrides on native substrates stems largely from difficulties inherent to nitride synthesis—primarily the high nitrogen overpressure required to avoid film decomposition and to produce high-quality material as well as the low solubility of nitrogen in the respective metal.

Epitaxial Growth

As part of growing a thin film, any suitable method may be used in fostering epitaxial growth according to the present application. There are a variety of existing methods for epitaxial growth generally, and the growth of nitride films on non-native substrates specifically. These methods include, without limitation, hydride and metal organic vapor phase epitaxy, reactive molecular beam epitaxy, migration-enhanced epitaxy (MEE), and others.

Metal-Organic Chemical Vapor Deposition

The metal-organic chemical vapor deposition (MOCVD) process is a slow growth rate process with a growth rate of a few microns per hour. In a typical gallium nitride (GaN)-based device growth process, a low-temperature buffer layer of GaN or $Al_xGa_{1-x}N$ (x=0-1) is first grown on a foreign substrate (e.g., sapphire or silicon carbide), followed by the growth of a few microns of GaN. The active device layer, such as quantum well structures for LEDs, is subsequently grown. A thin GaN nucleation layer of about 10 nanometers is first deposited on a sapphire substrate at a low temperature of 500-600° C. The GaN nucleation layer is annealed at high temperature to recrystallize the GaN, and epitaxial GaN film is grown at higher temperature (approximately 1000-1200° C.).

Plasma Enhanced Chemical Vapor Deposition

Plasma enhanced chemical vapor deposition (PECVD) is a CVD technology utilizing plasma to provide a portion of the energy for the deposition reaction to take place. PECVD beneficially utilizes a lower temperature than purely thermal processing methods. PECVD processing temperatures range between 200-400° C. PECVD films generally have higher etch rates, higher hydrogen content, and pinholes (especially for thinner films (~4000 Å)). However, PECVD can provide higher deposition rates than, for example purely thermal processing methods.

Molecular Beam Epitaxy

Molecular beam epitaxy (MBE) grows, for example, an AlN layer by subjecting the silicon substrate to background ammonia followed by repetitively alternative the flux of Al without ammonia, and ammonia with Al. After the surface of the silicon structure is sufficiently covered with AlN, the wafer is further subjected to a flux of ammonia and aluminum applied simultaneously to continue the epitaxial growth process. The process minimizes the formation of amorphous silicon nitride, $SiN_x$, compounds on the surface of the substrate which form due to background nitrogen levels in the molecular beam epitaxial growth apparatus, which is key for the formation of high quality AlN. The AlN layer may be further used as a buffer layer for AlGaN/GaN growth. After the AlN layer is grown on the silicon structure, the silicon structure may be subjected to a flux of Ga and nitrogen to form a layer of GaN.

Vapor Phase Epitaxy

Vapor phase methods, particularly vapor phase epitaxy (VPE), is one of the most commonly used methods for nitride synthesis. VPE is a chemical vapor deposition method which may be utilized to generates single or polycrystalline thin films. VPE is used primarily for IIIA-VA semiconductors including, without limitation, AlN, GaN, InN, GaAs, GaP, InP, GaAsP, InGaAsP, and others. Broadly, the process of vapor phase epitaxy for a compound semiconductor comprises placing a substrate in an epitaxial growth chamber, feeding two or more reactants gasses into the growth chamber, such that the chamber is supplied with a mixture of the gases reacting on the substrate so as to form the compound semiconductor in the form of a layer.

Hydride Vapor Phase Epitaxy

In the hydride vapor phase (HVPE) process, gallium chloride (GaCl), formed by reacting gaseous hydrochloric acid (HCl) with gallium metal in the upstream of the reactor, reacts with ammonia ($NH_3$), depositing GaN on the surface of a substrate. The size of the GaN crystal grown may be the same as the size of the substrate. Substrates such as sapphire, gallium arsenide, silicon carbide, and other suitable foreign substrates have been used. Since large-sized substrates with a diameter from 2 inches to 12 inches are available, large-sized GaN, in theory, could be grown with HVPE techniques. However, bulk GaN growth on sapphire substrate by HVPE encounters many obstacles, such as nucleation of polycrystalline material, cracking and microcracking during growth and cool down, and an unstable crystal growth front that leads to polycrystalline formation or microcracking during the bulk growth. Bulk GaN growth methods, in which multiple wafers can be produced, can significantly reduce the cost the GaN wafer manufacturing.

Liquid Phase Exfoliation

Liquid phase exfoliation generally pertains to rendering graphene viable for incorporation into various devices by exfoliating the graphite by a variety of methods. Liquid phase exfoliation may comprise (micro)mechanical, chemical, and electrochemical exfoliation of graphite. For example, stable graphene dispersions may be produced from the exfoliation of graphite in water and organic solvents. Further discussion of various liquid phase exfoliation techniques can be found in Quintana et al., *Liquid-Phase Exfoliated Graphene: Functionalization, Characterization, and Applications*, BEILSTEIN J. NANOTECHNOL. 5, 2328-2338 (2014), which is herein incorporated by reference in its entirety.

Remote Epitaxy

In addition or in alternative to the aforementioned methods of epitaxy, the 2D materials of the present application may be prepared using remote epitaxy. Epitaxy is frequently limited by the need for lattice matching between the two material systems. However, this requirement is less strict for van der Waals epitaxy, wherein epitaxy on 2D materials is mediated by weak van der Waals interactions, and further allows facile layer release from 2D surfaces. Beneficially, remote epitaxy enables any semiconductor film to be copied from underlying substrates through 2D materials, allowing the resultant epilayer to be quickly released and transferred to a desired substrate. Further discussion of and methods for conducting remote epitaxy can be found in Kim et al., Remove Epitaxy Through Graphene Enables Two-Dimensional Material-Based Layer Transfer, NATURE 544, 340-343 (2017), which is herein incorporated in its entirety.

Nucleation Layers

Many forms of VPE involve the formation of nucleation layers prior to film. Nucleation layers (NLs) can enhance film growth. The presence of a NL deposited at lower temperatures can improve film quality by providing a transition layer, which can result in subsequent increased nucleation density, and in some cases increased independence of the film from the registry of the underlying substrate. Nucleation layers are often deposited at temperatures lower than the particular growth temperature, and can be composed of a variety of materials, for example nitrides (such as GaN, AlN, and/or InN), arsenides, and/or phosphorous, to name a few. In an embodiment of the invention, AlN NLs approximately 50 nm thick deposited at 600° C. may be used to improve GaN films. Nucleation layers of GaN may also be deposited for GaN film growth though the evolution of these layers may differ from AlN, due to the effects of the ramping process between growth stages which can result in etching of regions of the GaN NL.

Nucleation layers may be grown by any suitable methods. For example, for nitride nucleation layers: AlN may be grown by MOCVD or MBE, GaN may be grown by MOCVD or MBE, AlGaN may be grown by MOCVD or MBE, etc. AlN layers may also be grown in the HVPE reactor by incorporating an Al source so that hydrochloric acid reacts with Al to form aluminum chloride, which reacts with ammonia in the deposition zone to form AlN on the substrate surface. In addition to AlN, other nucleation layers can also aid in GaN growth on amorphous substrates. For example, titanium can act as a NL, owing to its hexagonal structure and relatively small lattice mismatch with GaN; furthermore, GaN growth can be controlled on titanium NLs through the deposition of and $SiO_2$ mask onto the titanium layer which acts to control nucleation. GaN resulting from this method exhibits pyramidal geometries and good crystallinity.

Nitrogen Sources for Nitride Growth

According to the present application, a nitrogen source is used to treat 2D layers comprising GIIIC materials and chemically convert the GIIIC materials into a Group-III-V semiconductor seed layer. Any suitable nitrogen source may be used for nitridation according to the present disclosure. The most common nitrogen source used to grow nitride films via vapor phase epitaxy is ammonia ($NH_3$), which decomposes at growth temperatures to provide nitrogen for film growth. Hydrazine ($N_2H_4$) is also used, due to its relatively high volatility compared to $NH_3$, and detailed studies regarding film quality and purity as a function of both growth temperature and nitrogen source used have led largely to the adoption of $NH_3$ over $N_2H_4$ for nitride film growth. Other nitrogen sources used for nitride growth include monomethylhydrazine, dimethylhydrazine, and $Ga(C_2H_5)_3NH_3$. Additionally, studies have also shown that $NH_3$ plasmas, or $NH_3$ in combination with $H_2$ plasmas may be used to grow GaN. Nitrogen ($N_2$) and hydrogen ($H_2$) are commonly used as carrier gases in nitride growth, and gallium chloride (GaCl), trimethyl gallium (TMG), and triethyl gallium (TEG), trimethyl aluminum, and trimethyl indium, as well as InCl and InCl3 are the primary group-III sources used in vapor phase epitaxy of nitride materials.

Substrates

As used herein, the term substrate broadly refers to the substance or layer underlying a thin film, and upon which a thin film is deposited and/or grown. Substrates according to the present application may be amorphous or crystalline. Typically, there must be lattice matching between the substrate and the film, e.g. crystalline films require crystalline substrates. However, this requirement is less strict for van der Waals materials. In a preferred embodiment, the substrate is amorphous.

Substrate selection impacts the properties of the resulting thin film, especially mechanical and electrical performance. The selection of a substrate based on desired electrical performance primarily turns on the dielectric constant of the material. In comparison, the selection of a substrate based on desired mechanical performance (e.g. thermal conductivity (TC) and the coefficient of thermal expansion (CTE)) turns on heat conduction and induced stresses experienced in the particular application.

Any suitable substrate material may be used, including, without limitation, $SiO_2$/Si, alumina ($Al_2O_3$), aluminum nitride (AlN), beryllia (BeO), quartz, titanate/titanate ceramics, ferrite, and/or sapphire. In a preferred embodiment, the substrate is a silicon-based substrate, preferably silica ($SiO_2$) and/or silicon (Si).

Group-III Chalcogenides and Synthesis of the Same

According to the present application, Group-III chalcogenides (GIIIC) are used as a precursor to group III-V semiconductors. In particular, GIIIC materials are grown on a substrate according to the present application, and are subsequently treated (e.g. nitridation and/or exfoliation) in order to transform the GIIIC materials into a semiconductor. In a preferred embodiment, GaSe layers are chemically converted to a GaN seed layer. In a further embodiment, InSe layers are chemically converted into an InN seed layer.

Any suitable Group-III chalcogenide may be used according to the present application. Generally, the term group-III chalcogenides (GIIIC) refers to a compound containing one or more chalcogen element (e.g. O, S, Se, Te, Po) and one or more group III element (e.g. Al, Ga, In). In a preferred embodiment, the Group-III chalcogenide comprises GaSe and/or InSe. GIIICs may be amorphous or crystalline, and they are semiconductors with a band gap of about 1-3 eV. Chalcogenides in general demonstrate strong and varied responses to optical, electrical, and thermal stimuli. In particular, chalcogenide semiconductors have low phonon-energy materials, are usually transparent in visible to the infrared spectrum, and are optically nonlinear. Chalcogenide semiconductors are important materials for optical applications such as solar cells, thermal imaging, sensors, and others.

Two-dimensional transition metal dichalcogenides (TMDs) may be synthesized by a variety of methods such as powder vaporization (PV) including the aforementioned methods, e.g. metal-organic chemical vapor deposition, molecular beam epitaxy, inorganic chemical vapor deposition, and/or metal-chloride vaporization. In a preferred embodiment, PV is used. PV generally utilizes a horizontal tube furnace, where the chalcogen powder is placed upstream of the hot zone, and just outside the portion of the tube encompassed by furnace heating coils. Additionally, a crucible with metal-oxide (M-O) powder is placed in the hot-zone of the furnace, and sample substrates are placed downstream of the M-O crucible or face-down directly on top of the M-O crucible. Upon heating, the metal-oxide and chalcogen powders are vaporized and transported downstream in the furnace, coating the substrate material and forming $MX_2$. In general, powder vaporization techniques are very successful at achieving monolayer and few layer TMD films over large areas.

Group III-V Semiconductors

Any suitable Group III-V semiconductor may be generated from GIIIC materials according to the present application. A Group III-V compound semiconductor is an alloy containing elements from groups III and V in the periodic table. Specifically, Group III contains B, Al, Ga, and In. Group V contains N, P, As, and Sb. These elements may be combined into a wide variety of material systems. Further, within the category of Group III-V semiconductors, there is the nitride semiconductors subset.

Group II-V Nitride Semiconductors

A Group III-V nitride semiconductor is any semiconductor that includes nitrogen and at least one group III element, including but not limited to, GaN, AlGaN, InN, AlN, InGaN, InAlGaN and the like. Group III-V nitride compounds such as AlN, GaN, InN, and alloys such as AlGaN, InGaN, and AlGaInN, are direct bandgap semiconductors with bandgap energy ranging from about 0.6 eV for InN to about 6.2 eV for AlN. These materials may be used to produce light emitting devices such as LEDs and LDs in short wavelength in the green, blue and ultraviolet (UV) spectra. Blue and violet laser diodes may be used for reading data from and writing data to high-density optical storage discs, such as those used by Blu-Ray and HD-DVD systems. By using proper color conversion with phosphors, blue and UV light emitting diodes can be made to emit white light, which may be used for energy efficient solid-state light sources. Alloys with higher bandgaps may be used for UV photodetectors that are insensitive to solar radiation. The material properties of the III-V nitride compounds are also suitable for fabrication of electronic devices that may be operated at higher temperature, higher power, and higher frequency than conventional devices based on silicon (Si) or gallium arsenide (GaAs).

GaN

GaN and its alloys offer a wide range of energy band gaps. GaN typically crystallizes in the wurtzite structure, which is subject to strong internal spontaneous and piezoelectric fields. Optoelectronic devices based on such nitride ternary alloys have the capability to operate at energies in the mid-ultraviolet to infrared range. Further, the AlGaN/GaN heterojunction has a large band discontinuity that contributes to GaN-based devices having improved output power density and improved thermal conductivity. As a result, GaN devices can operate effectively at high temperatures.

InN

InN is a direct narrow bandgap semiconductor with a narrow bandgap semiconductor (~0.7 eV at ambient temperature). When combined with gallium to produce InGaN, the bandgap is tunable over the range of 0.7-3.4 eV which encompasses the IR, UV and visible spectrum. InN may be found in both a wurtzite and zinc blend structure. Further, InN demonstrates an extreme electron accumulation at all surfaces and is a heavily unintentionally n-type doped system. This is a result of InN's defects within the lattice and the property of the branch point energy being well above the conduction band minimum, making the defects donor-like.

Using Seed Laver to Grow Group III-V Material on an Amorphous Substrate

The present disclosure relates to bulk Group III-V layer growth on an amorphous substrate by way of an ultra-thin seed layer. In one embodiment of the invention, that amorphous substrate is $SiO_2$ over Si, a typical and readily available substrate for semiconductor applications.

Realizing ultra-thin seed layers through a multi-step process comprising growing or depositing a two-dimensional (2D) layer on a substrate. The growing or deposition can occur via the synthesis of naturally layered, Group III chalcogenides, depositing of an exfoliated 2D layer, or depositing via another deposition method. After growing or depositing the the 2D layer, there is subsequent processing (also referred to as a treating step) that leads to an atomic-exchange of the chalcogen and a Group V species to form one or more seed layers. In an aspect of the invention, the treating step comprises a chemical conversion. In a preferred embodiment, the treating step comprises annealing in ammonia (ammonolysis) leads to an exchange of the chalcogen for nitrogen. Following the treating step, there is a transforming step where the one or more seed layers transform into a thin film. This transforming step can be performed by a number of methods described herein to grow a thin film on the substrate. For example, in a preferred embodiment GaSe forms GaN after nitridation, the resulting ultra-thin GaN layer then acts as an effective seed layer for growth of bulk GaN on amorphous substrates. Optionally, after the transforming step, the thin film can be mechanically exfoliated to form a free-standing thin film.

Methods and Procedures

Few-layer GaSe may be synthesized via powder vaporization (PV) of bulk GaSe crystals placed beneath face-down substrates. GaSe synthesis is carried out at 700° C.-850° C. under a constant flow of 200 standard cubic centimeters per minute (sccm) argon (Ar) and a pressure of 300 Torr. The bulk precursor may further be synthesized by combining gallium (Ga) metal (99.999%, Sigma Aldrich) with $Ga_2Se_3$ powder (99.99%, Alfa Aesar) in a 1:1 atomic ratio and heating this mixture in a sealed ampoule at 960° C. Preferred substrates include 300 nm $SiO_2$/Si and epitaxial graphene grown via silicon sublimation from silicon carbide. Following synthesis, GaSe layers may be annealed in a 1:1 $NH_3$/Ar atmosphere at 600° C. and 600 Torr for 30 min.

Atomic force microscopy measures surface roughness of the material before and after nitridation and scanning electron microscopy allows for assessment of surface morphology. Transmission electron microscopy (TEM) and scanning transmission electron microscopy (STEM) provide information on atomic-scale crystallinity of the layers, while selected area electron diffraction (SAED) shows the crystal structure of the regions observed with STEM. Energy dispersive spectroscopy (EDS) provides elemental maps of the synthesized and nitri-dated materials. Density functional theory (DFT) calculations provide insight to the GaSe→GaN transformation, and may be carried out using the ViennaAb initio Simulation Package using the plane-wave basis and projector augmented wave method. The Perdew-Burke-Ernzerhoff generalized gradient functional may be used to be the exchange-correlational functional. A 550 eV cutoff energy is used when the convergence tests indicate that energies are converged to within 1 meV/atom with a 15×15×1 k-point mesh. Spin polarization is applied in all the calculations and structure relaxation is iterated until energy differences are below $10^{-6}$ eV and until all forces on the atoms are below 0.05 eV Å$^{-1}$.

Formation of Single Crystal, Micron-Scale Domains of GaSe on SiO$_2$

In accordance with the present application, the synthesis of GaSe via PV preferably leads to single crystal, micron-scale domains of mono- to few-layer GaSe on SiO$_2$ and graphene substrates. While as-grown GaSe layers may be investigated for their intrinsic properties, layers resulting from exposure to NH$_3$ environments provide a means to investigate the formation of nitride materials in a new context. Specifically, according to the present application, annealing GaSe layers in NH$_3$ between 600° C. and 700° C. leads to the formation of ultra-thin GaN layers. Optionally, TEM and SAED of GaSe before and after nitridation may be used to verify the transformation from GaSe to GaN.

In a preferred embodiment, rather than transforming to single crystal '2D' GaN, the nitridated GaSe forms a highly textured, ~0.8 nm thick nanocrystalline wurtzite GaN layer. Nanocrystalline material may also be observed following ammonolysis of exfoliated GaSe layers through an increase in surface roughness (0.1-0.5 nm), further indicating a chemical reaction and structural modification has taken place. Surprisingly, the severe lattice mis-match between GaSe (3.755 Å) and wurtzite GaN (3.189 Å) as well as different charge states of the Ga when bonded as GaSe versus GaN suggest that maintaining a single-crystal monolayer GaSe to GaN transformation throughout nitridation is unlikely without additional external stabilizing forces.

Nitridation of Layered Selenides

Nitridation of layered selenides is unique to the GIII element involved. According to the present application, in order to investigate the effect of NH$_3$ on different GIIICs, exfoliated InSe layers may also be subject to ammonolysis at temperatures >500° C. Evident through optical microscopy, nitridation leads to an etching effect of the InSe layers, rather than the complete transformation of layers to InN.

Furthermore, according to the present application and as demonstrated by EDS of cross-sections of nitridated InSe, the nitridation process is not an effective means of achieving conversion from InSe to InN at temperatures where the NH$_3$ is thermally decomposed. Instead, the majority of the layers remain composed of In and Se, with nitrogen (N) being nearly indistinguishable from the background signal, even with extended periods (>90 min) of NH$_3$ exposure. Despite the likely presence of some InN species, the effect of NH$_3$ atmospheres on InSe layers differs significantly from that of GaSe. It should be noted that even with the low efficiency of decomposition of NH$_3$ at nitridation temperatures, GaSe transforms to GaN, verifying that enough NH$_3$ decomposes during the nitridation processes to move GaSe conversion reactions forward. Thus, while the investigation of InSe to InN transformation is intriguing, it may require lower temperatures than currently possible in this study due to thermal limitations in cracking NH$_3$. One possible solution may be to utilize a plasma-enhanced nitridation process that could enable low-temperature studies with reactive nitrogen species.

Structural Decomposition of GaSe and Subsequent Reaction with Nitrogen

Based on the aforementioned discussion of nitridation, according to the present application the transformation of GaSe to GaN involves the structural decomposition of GaSe followed by reaction with nitrogen. This is evident when investigating thick, multilayer GaSe, which requires extended ammonolysis for complete transformation. According to the methods of the application, multilayer (~30-50 nm) GaSe exposed to NH$_3$ for 30 min is not fully transformed, and instead exhibits a bilayer-type structure, where the top-most layers are transformed to Ga$_x$Se$_y$N$_z$ and the bottom layers remain single crystal GaSe. EDS maps of the partially nitridated GaSe qualitatively indicate Se deficiency in the outer, amorphous region, along with a small N signal. Furthermore, XPS of GaSe as a function of nitridation time shows a decrease in the Se 3d signal with increasing nitridation time, indicating a time dependence on the transformation of GaSe layers to GaN. X-ray photoelectron spectroscopy also shows consistent intensity of Ga 2p peaks for these samples, indicating that no significant loss of Ga occurs during nitridation. Identification of the N1s peak following ammonolysis is not possible due to a severe overlap with the Ga auger line shape near the expected energy of N 1s in GaN (397 eV). This overlap is observed in samples even following the ammonolysis process, due to non-uniform GaSe thicknesses present following GaSe growth, and is evident from comparison of the Ga LMM-N is region for a number of reference samples including GaN, GaAs, SiN, and GaSe.

To further understand the Ga LMM-N is line shape in nitridated samples, synthetic spectra may be constructed using reference samples, where variation of the Ga:N ratio shows predicted spectra for different levels of N incorporation. According to the present application, these spectra indicate that reasonable observation of a N 1s peak in nitridated samples is unlikely when Ga:N is greater than 3:1 or 4:1. Thus, while XPS can be used to observe changes in Se signal following ammonolysis, it cannot provide direct evidence of nitride formation, due to variation in grown GaSe thickness across the substrates. To further investigate the impact of GaSe thickness on nitridation, TEM studies may be conducted on mono- and multilayer GaSe samples.

According to the invention, the presence of an amorphous, ternary outer layer in partially transformed bulk GaSe suggests that rather than a simple Se and N exchange, transformation to GaN requires significant structural modifications. Per an embodiment of the present application, at roughly 600° C., Se loss occurs due to thermal decomposition of GaSe, which likely leads to Ga dangling bonds, and enables nitridation of the GaSe structure.

Quantification of the Energetic Information Associated with Initial, Potential Intermediate, and Final Structures Density functional theory (DFT) calculations may be performed to quantify the energetic information associated with initial, potential intermediate, and final structures. The reaction key reaction is GaSe+NH$_3$→GaN+Se+3/2H$_2$, which considers that ammonia decomposes into atomic nitrogen and amine fragments at elevated temperatures. Specifically, DFT analysis may be used to investigate the introduction of N into bulk GaSe as well as the removal of Se from bulk GaN, where N, $NH_x$, and Se atoms are in gaseous form. It should be noted that analysis includes the addition of atomic energies of Se and N in their most stable forms to the total energy of the reaction in order to balance the total number of each type of atom involved.

According to the present application, the DFT results indicate that bulk GaN is more stable than bulk GaSe, where the difference in the energy of formation between the two materials is 2.306 eV/atom. The present invention considered two further mechanisms: (1) the occupation of interstitial sites in GaSe by N atoms which can subsequently fill the space of Se atoms that leave the GaSe surface, and (2) the formation of Se vacancies on the surface of bulk GaSe followed by occupation of these vacancies with N atoms. In accordance with the invention, the energy barrier for N atoms transitioning from absorption on the GaSe surface to occupation of an interstitial site in bulk GaSe is +0.096 eV/atom, and that the movement of atomic N from an interstitial site to a Se vacancy requires an additional +0.071 eV/atom. This value is relatively small compared to the +0.625 eV/atom associated with N directly substituting a Se vacancy. For comparison, the energy barrier to achieving substitutional and interstitial Se are 0.42 eV/atom and 0.051 eV/atom in bulk GaN, respectively. Consequently, the case of Se leaving bulk GaN is predicted to take place via departure from a substitutional site and from an interstitial site. While nanocrystalline in nature, the formation of ultra-thin, GaN layers from GaSe holds particular promise in the context of 'seed layers' for the synthesis of thick GaN on amorphous substrates. Typically, crystalline GaN films require crystalline substrates such as sapphire and silicon carbide rather than amorphous substrates. However, van der Waals materials like GaSe may be grown on a wide range of substrates, both crystalline and amorphous. Thus, utilizing GaSe as a starting material according to the present application offers the potential to realize GaN on amorphous substrates such as silica ($SiO_2$).

The Ability of GaSe to Realize GaN on Amorphous Substrates

In an embodiment, mono- to few-layer GaSe may be grown on 300 nm $SiO_2$/Si substrates via PV at 700° C. These layers may then be nitridated: in a preferred embodiment they are nitridated at 600° C. and 600 Torr for 30 min. According to the present application, this process results in ultra-thin, polycrystalline GaN.

In another embodiment, GaN films with a thickness of about 50 nm to about 5 microns are additionally grown on the transformed 2D layers. Preferably, such films are grown via hydride vapor phase epitaxy (HVPE). In a preferred embodiment, the GaN films may be grown in a vertical HVPE reactor, preferably at 1030° C. using gallium chloride and $NH_3$ for the group III and group V precursors, respectively. The recipe scheme is similar to processes typically utilized to produce undoped thin films of GaN on AlN on Si.

In another embodiment, GaN films with a thickness of roughly tens of microns are grown on the transformed 2D layers; preferably having a thickness of between about 5 microns and about 90 microns, more preferably between about 10 microns and about 70 microns, most preferably between about 15 microns and about 60 microns. These films are capable of separation from the substrate to become free standing.

According to these methods, surprisingly, GaN growth on regions without a seed layer (e.g. bare $SiO_2$) is precluded, while regions where GaN films exist differ dramatically based on the initial layer thickness of the nitridated GaSe. GaN films grown on monolayer seed regions exhibit a rough surface morphology and appear polycrystalline in nature, while GaN films grown on transformed few-layer GaSe exhibit smooth surfaces and maintain the triangular morphology of the starting GaSe. In regions where the GaSe exhibits mono- to few-layers, a transformation from polycrystalline to single crystalline GaN is directly observed.

These observations may be optionally verified using SAED of the two distinct regions, where GaN films grown on few-layer seeds are single-crystal in nature, while monolayer seeds lead to polycrystalline GaN films. SAED patterns correspond to acquisition locations 200 nm above the GaN/$SiO_2$ interface. Further, and optionally, cross-sectional STEM may be utilized. According to the present application, in addition to impacting the microstructure, cross-sectional STEM indicates that there are also fewer defects at the $SiO_2$/GaN interface in the case of GaN grown on thicker seed layers.

There may be several reasons for this phenomenon to occur. The first possibility is that the transformation of GaSe→GaN leads to significant structural changes that result in nano-sized holes in monolayer GaN films, which in turn exposes the HVPE-grown GaN to bare $SiO_2$. This subsequently interrupts the epitaxy process (GaN does not grow directly on $SiO_2$), thereby leading to polycrystalline, rough films due to the heterogeneous surface. Alternatively, or additionally, thicker few-layer seeds are able to screen the effects of the amorphous substrate, while monolayers are not. Such a phenomenon would be similar to recent reports of graphene acting as a transparent release layer for semiconductor epitaxy.

EXAMPLES

Materials

Bulk GaSe was synthesized by combining Ga metal and $Ga_2Se_3$ powder in a 1:1 atomic ratio with a mortar and pestle. The mixture was then sealed in a quartz ampoule under vacuum and annealed at 960° C. for one hour, with a two-hour furnace ramp time, after which it was cooled to 850° C. in one hour and then naturally cooled by opening the furnace. This synthesis occurred at Oak Ridge National Laboratory.

99.999% Ga metal supplied by Sigma Aldrich.

99.999% $Ga_2Se_3$ powder supplied by Alfa Aesar.

Substrates used in these studies include 300 nm $SiO_2$ on Si and epitaxial graphene grown via silicon sublimation from SiC. The substrates were prepared for experimentation by sequential sonication in acetone, isopropyl alcohol, and deionized water for 5-10 minutes each, then dried with nitrogen. The substrates were then placed in 5 mL of Nano-Strip and heated on a hotplate at 80° C. for 20 minutes, after which they were rinsed in deionized water and sonicated in deionized water for 5-10 minutes. The clean substrates were then dried with nitrogen.

Nano-Strip: a stabilized formulation of sulfuric acid and hydrogen peroxide compounds by KMG Chemicals, Inc.

Characterization

TEM: Thermo Fisher Scientific Talos F200X Transmission Electron Microscopy with an acceleration voltage of 80 kV. HRTEM: bright field High Resolution TEM technique used to image the nanostructures.

STEM: high resolution Scanning Transmission Electron Microscopy performed in a Thermo Fisher Scientific dual aberration corrected Tital 3 G2 60-300 S/TEM at 200 kV by using a high angle annular dark field (HAADF) detector. A beam current of 70 pA, beam convergence of 30 mrad, $C_2$ aperture of 70 μm, and camera length of 115 mm were used for STEM image acquisition.

SAED: Selected Area Electron Diffraction used to examine the crystal structure.

HAADF: Fischione High Angle Annular Dark Field detector with a collection angle of 51-300 mrad for Z-contrast imaging.

EDS: Energy Dispersive Spectroscopy; STEM EDS maps were collected using the SuperX EDS system with 4 EDS detectors surrounding the sample.

AFM: Atomic Force Microscopy measurements taken with a Bruker Dimension Icon at scan rates of 0.7-1 Hz.

XPS: X-ray Photo-electron Spectroscopy carried out with a Physical Electronics Versaprobe II equipped with a monochromatic Al K-alpha X-ray source with photon energy=1486.7 eV and a concentric hemispherical analyzer. High resolution spectra were obtained over an analysis area of 200 μm at a pass energy of 23.5 eV and resolution of 0.1 eV. The resulting spectra were charge referenced to adventitious carbon corresponding to carbon is at 284.8 eV.

SEM: field effect Scanning Electron Microscopy obtained with a Zeiss Leo 1530 using 5.00 kV.

Example 1

Single-crystal, mono- to few-layer GaSe layers were synthesized via powder vaporization of 7-12 mg bulk GaSe crystals placed beneath face-down 1×1 cm substrates of 300 nm $SiO_2$/Si or epitaxial graphene on SiC. GaSe crystal powders were vaporized beneath the substrates at temperatures from 700-850° C. for 30 minutes, under a constant flow of 200 sccm Ar and a pressure of 300 Torr. A ramp rate of 20° C. per minute was used to bring the furnace to growth temperature and the rate of rise of pressure in the tube furnace was ensured to be less than or equal to 5 mTorr per minute before each growth process. The furnace was cooled naturally to room temperature prior to sample removal.

Figure 1B:
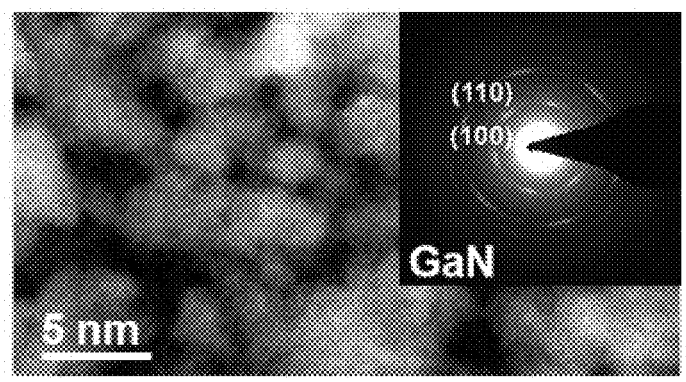
FIG. 1B shows a high resolution TEM image of a GaN layer after nitridation of the GaSe layer shown in FIG. 1A. The inset shows the corresponding SAED pattern confirming wurtzite GaN.
Figure 2A:
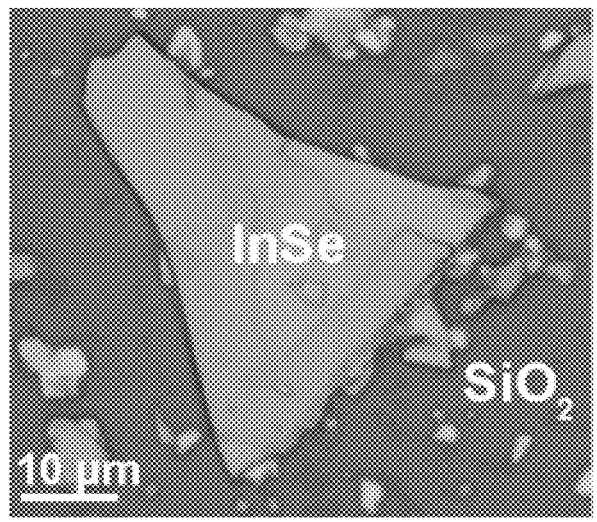
FIG. 2A shows an optical image of exfoliated InSe layers before ammonolysis.
Figure 2B:
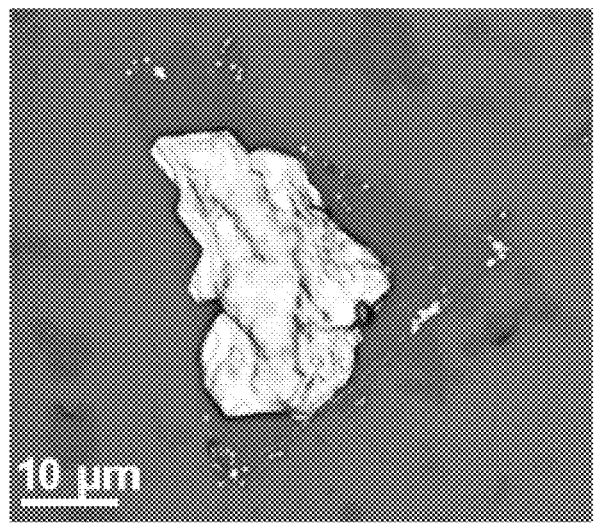
FIG. 2B shows an optical image of the exfoliated InSe layers of FIG. 2A after ammonolysis.
Figure 2C:
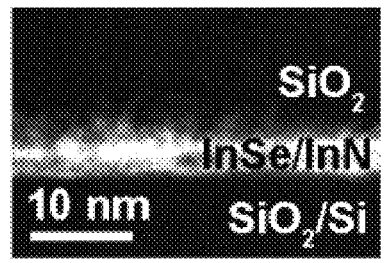
FIG. 2C shows an EDS image of a nitridated InSe cross section of the exfoliated InSe layer of FIG. 2B.
Figure 2D:
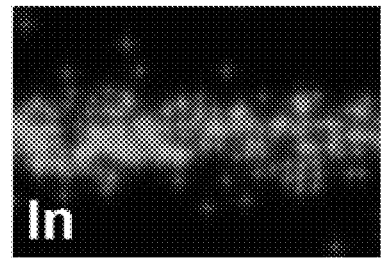
FIG. 2D shows EDS elemental mapping of the nitridated InSe layer of FIG. 2B showing In signals.
Figure 2E:
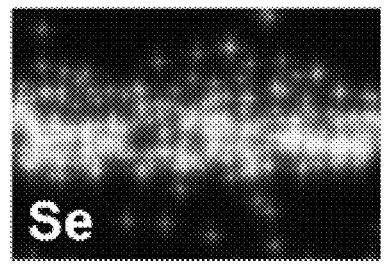
FIG. 2E shows EDS elemental mapping of the nitridated InSe layer of FIG. 2B showing Se signals.
Figure 2F:
FIG. 2F shows EDS elemental mapping of the nitridated InSe layer of FIG. 2B showing N signals.
Figure 3A:
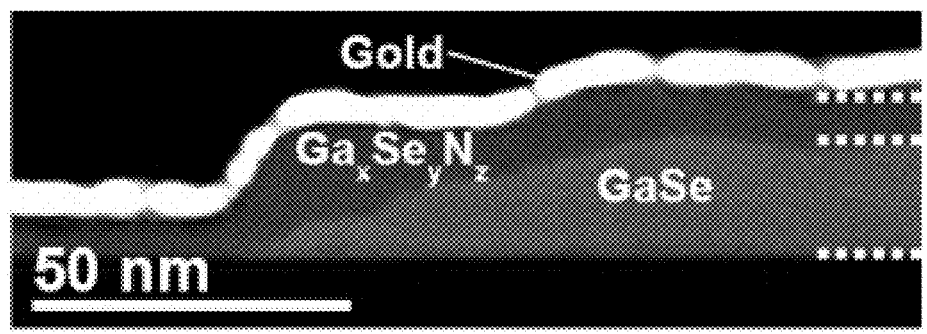
FIG. 3A shows a lower magnification cross-sectional STEM image of multi-layer nitridated GaSe.
Figure 3B:
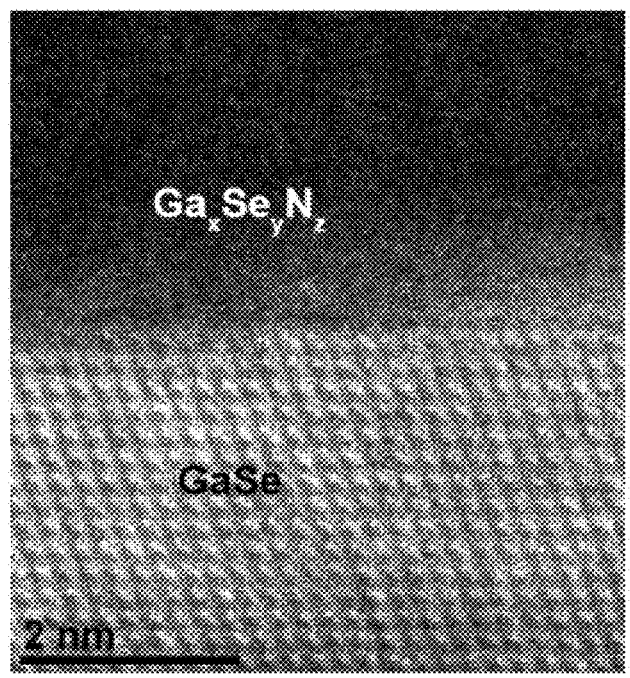
FIG. 3B shows a magnification of the boundary between the light and dark regions within the cross-sectional image of FIG. 3A showing the amorphous $Ga_xSe_yN_z$ outer region and crystalline GaSe inner region following nitridation.
Figure 3C:
FIG. 3C shows EDS elemental mapping of Se in the cross-section of FIG. 3A.
Figure 3D:
FIG. 3D shows EDS elemental mapping of N in the cross-section of FIG. 3A.

The GaSe layers were then placed in a tube furnace and heated to 600° C. at 600 Torr, under constant flow of Ar at 100 sccm. A furnace ramp rate of 200° C. per minute was maintained and 100 sccm of $NH_3$ was introduced once the furnace reached nitridation temperature. The furnace was cooled naturally to room temperature prior to sample removal. Annealing the GaSe layers in $NH_3$ led to the formation of nanocrystalline, ultra-thin (<1 nm) wurtzite GaN layers, as shown in FIG. 1.

Example 2

Exfoliated InSe layers were subjected to ammonolysis at temperatures above 500° C., leading to an etching effect of InSe layers rather than the transformation to InN, even at process times longer than 90 minutes, as shown in FIG. 2, indicating differences in atomic-level interactions between $NH_3$ and different Group-III chalcogenides.

Example 3

Multilayer GaSe exposed to $NH_3$ for 30 minutes, not long enough for complete nitridation, exhibits a bilayer-type structure where the top layers are $Ga_xSe_yN_z$ and the bottom layers remain single-crystal GaSe, as indicated in FIG. 3. Images (g) and (h) in FIG. 3 show Se deficiency in the outer, amorphous region along with a small nitrogen signal. This indicates the transformation involves the structural decomposition of GaSe followed by reaction with nitrogen. The presence of this amorphous, ternary outer layer in partially transformed bulk GaSe suggests that rather than the occurrence of a simple Se and N exchange, transformation to GaN requires significant structural changes.

Figure 4A:
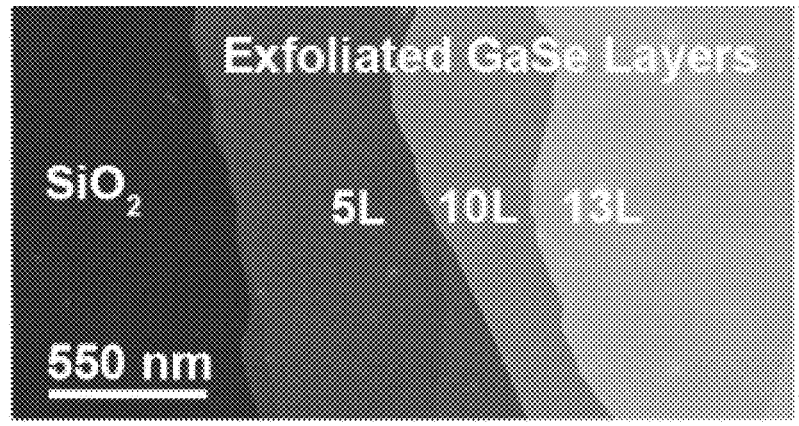
FIG. 4A shows an AFM image of exfoliated GaSe layers before nitridation.
Figure 4B:
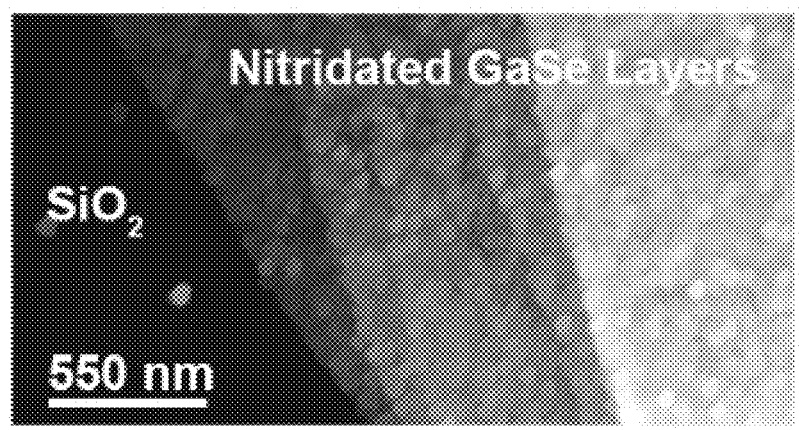
FIG. 4B shows an AFM image of the exfoliated GaSe layers of FIG. 4A after nitridation.
Figure 5A:
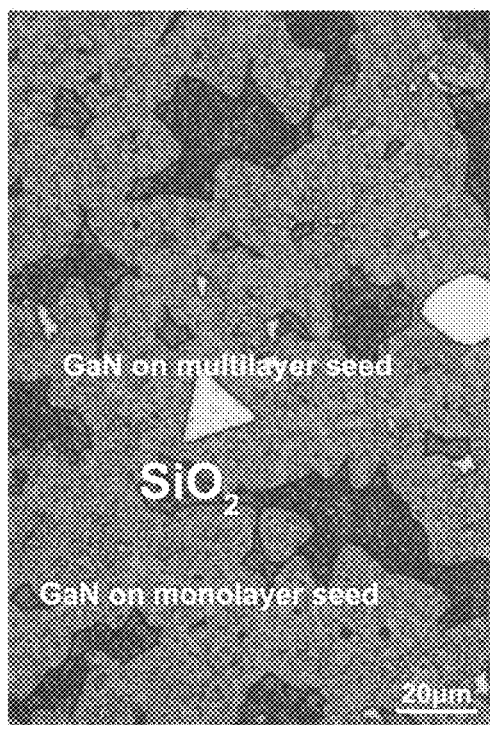
FIG. 5A shows an optical image of GaN films grown on nitridated GaSe seed layers.
Figure 5B:
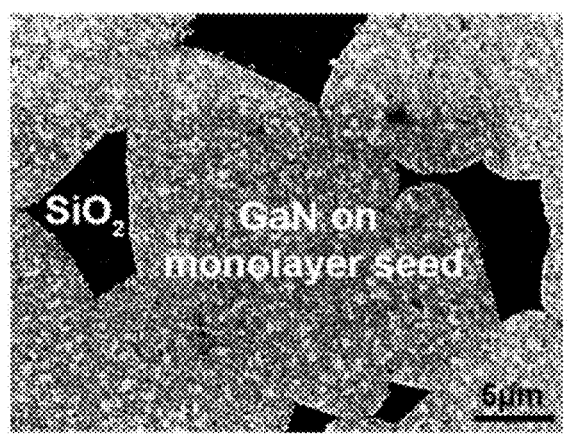
FIG. 5B shows a SEM image of GaN films grown on a monolayer seed layer.
Figure 5C:
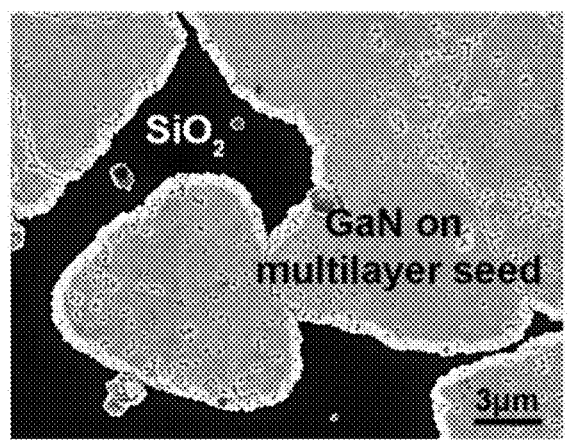
FIG. 5C shows a SEM image of GaN films grown on a multilayer seed layer.
Figure 5D:
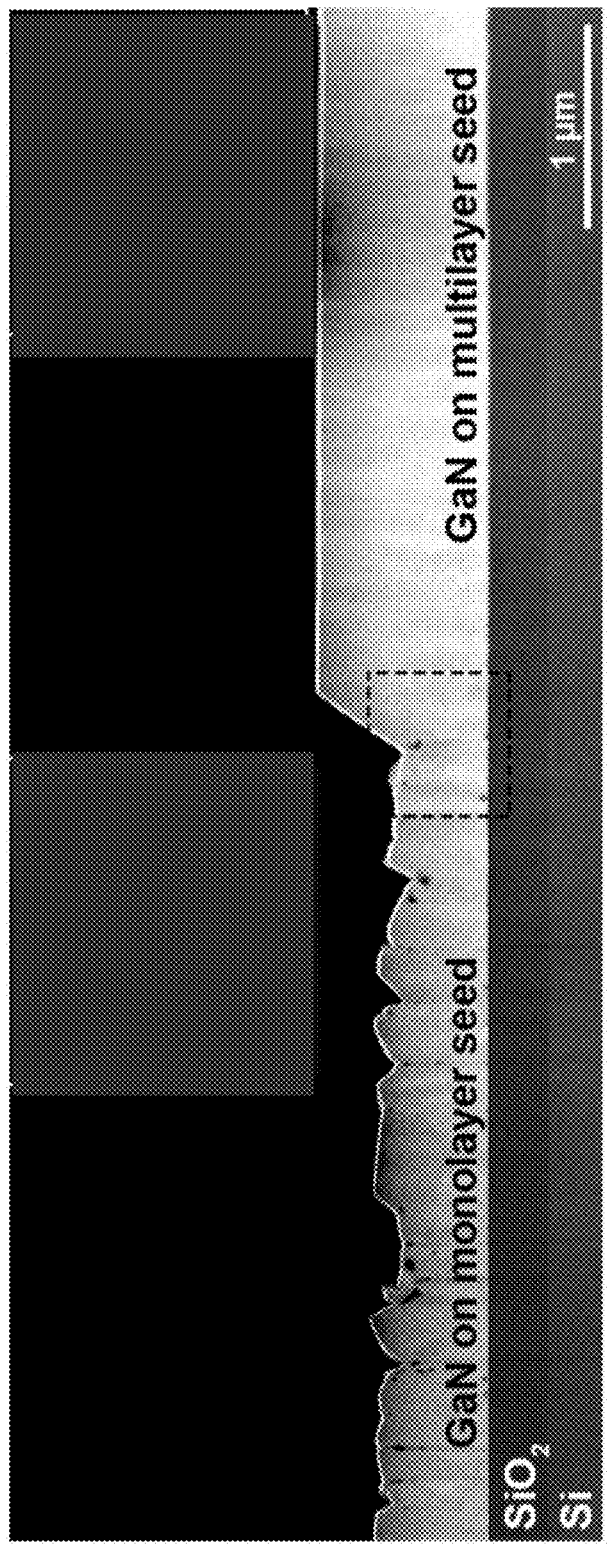
FIG. 5D shows a cross-sectional STEM image where thicker seed layers result in smoother GaN film formation.

Moreover, GaSe layers fabricated by exfoliation show nanocrystalline material following ammonolysis, as shown in FIG. 4, further indicating a chemical reaction and structural modification has taken place.

Example 4

Ultrathin GaSe layers were grown on 300 nm $SiO_2$/Si substrates via powder vaporization at 700° C. as shown in FIG. 5. Those layers were then nitridated at 600° C. and 600 Torr for 30 minutes. Then GaN films with thicknesses of roughly 850 nm were grown via hydride vapor phase epitaxy (HVPE) on the transformed layers. This GaN film growth occurred in vertical HPVE reactors at 1030° C. using GaCl and $NH_3$ as precursors.

See images (a)-(d) in FIG. 5 which illustrate how GaN morphology differs depending on seed layers. GaN films grown on regions of multilayer seed layers exhibit smooth surfaces and maintain the triangular morphology of the starting GaSe, while those grown on monolayer seed layers exhibit rougher surfaces and deviate in morphology from the initial seed layer. There are also fewer defects at the $SiO_2$: GaN interface in the regions using thicker seed layers. Additionally, GaN films nucleating on multilayer seed layers are single-crystal in nature, where monolayer seed layers lead to polycrystalline GaN films.

What is claimed is:

1. A method of using seed layers to grow a thin film, comprising:
   (a) growing or depositing a two-dimensional (2D) layer on a substrate; wherein the two-dimensional (2D) layer comprises one or more group-III chalcogenides (GIIIC);
   (b) treating the two-dimensional (2D) layer to form one or more seed layers; wherein the one or more seed layers comprise a Group III nitride; and wherein the one or more seed layers are formed by annealing the two-dimensional (2D) layer in ammonia; and
   (c) transforming the one or more seed layers into a thin film.

2. The method of claim 1, wherein the substrate comprises silicon dioxide ($SiO_2$), silicon (Si), alumina ($Al_2O_3$), aluminum nitride (AlN), beryllia (BeO), quartz, titanate, ferrite, and/or sapphire.

3. The method of claim 1, wherein the two-dimensional (2D) layer is deposited on the substrate, and wherein the two-dimensional (2D) layer is obtained by exfoliation, wherein the exfoliation is liquid or mechanical exfoliation.

4. The method of claim 1, wherein the Group III nitride is GaN or InN.

5. The method of claim 1, wherein the one or more group-III chalcogenides (GIIIC) comprises gallium selenide (GaSe) and/or indium selenide (InSe).

6. The method of claim 1, wherein the transforming step comprises conducting epitaxial growth, wherein the epitaxial growth comprises hydride vapor phase epitaxy (HVPE), chemical vapor deposition (MOCVD), plasma enhanced chemical vapor deposition (PECVD), molecular beam epitaxy (MBE), liquid phase exfoliation, and/or remote epitaxy.

7. The method of claim 1, wherein the two-dimensional (2D) layer is grown on the substrate using powder vaporization (PV).

8. The method of claim 1, wherein the one or more seed layers have a thickness of less than about 3 nm.

9. The method of claim 1, wherein the one or more seed layers is a monolayer.

10. The method of claim 9, wherein the thin film is a single-crystal film.

11. The method of claim 1, wherein the one or more seed layers is a multilayer.

12. The method of claim 11, wherein the thin film is a polycrystalline film.

13. The method of claim 1, wherein the substrate is amorphous.

14. The method of claim 1, wherein the thin film has a thickness of between about 50 nm to about 5 microns.

15. The method of claim 1, wherein the method further comprises (d) mechanically exfoliating the thin film providing a free-standing thin film.

* * * * *